(12) United States Patent
Robinson et al.

(10) Patent No.: US 10,090,847 B1
(45) Date of Patent: Oct. 2, 2018

(54) COMPLETE COMPLEMENTARY CODE PARALLEL OFFSETS

(71) Applicant: Raytheon Company, Waltham, MA (US)

(72) Inventors: Ian S. Robinson, Waltham, MA (US); James Toplicar, Waltham, MA (US); John G. Heston, Waltham, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/819,628

(22) Filed: Nov. 21, 2017

(51) Int. Cl.
*H03M 1/20* (2006.01)
*H03M 1/06* (2006.01)
*H03M 1/36* (2006.01)

(52) U.S. Cl.
CPC ......... *H03M 1/0641* (2013.01); *H03M 1/368* (2013.01)

(58) Field of Classification Search
CPC ... H03M 1/0641; H03M 1/368; H03M 1/0673
USPC ........................................ 341/131, 155, 159
See application file for complete search history.

(56) References Cited

U.S. PATENT DOCUMENTS

| | | | | |
|---|---|---|---|---|
| 7,277,033 B1 | * | 10/2007 | Kriz | H03M 1/06 |
| | | | | 341/131 |
| 8,648,741 B2 | * | 2/2014 | Thomas | H03M 1/0673 |
| | | | | 341/131 |
| RE45,798 E | * | 11/2015 | Thomas | H03M 1/0673 |

\* cited by examiner

*Primary Examiner* — Khai M Nguyen
(74) *Attorney, Agent, or Firm* — Burns & Levinson, LLP; Joseph M. Maraia

(57) ABSTRACT

A system and method of converting an analog input signal to a digital output signal includes coupling an analog input signal to a plurality of analog-to-digital converters (ADCs) arranged in a parallel configuration. Pseudo-random discrete valued complementary offset voltage levels that span an input voltage range of the sum of the plurality of ADCs are generated. An amount of continuous, analog dither that randomly varies at values between the discrete offset voltage levels is generated, the analog dither being less than steps between the discrete offset voltage levels. On different clock cycles, different discrete offset voltage levels are coupled to at least some of the ADCs. At each ADC, the respectively coupled analog input, discrete offset voltage level, and continuous analog dither are quantized to obtain a digital output. The respective digital outputs are combined to obtain a linearized digital representation of the analog input signal.

28 Claims, 9 Drawing Sheets

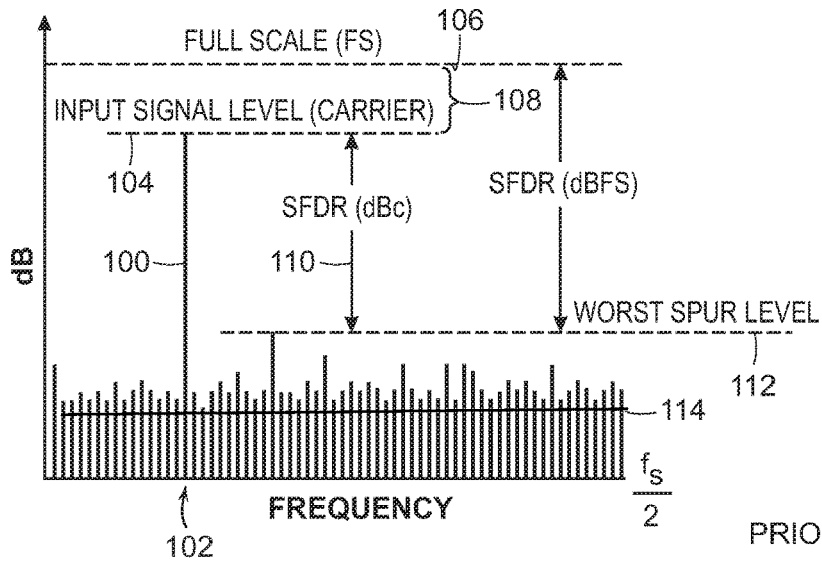
PRIOR ART FIG. 1
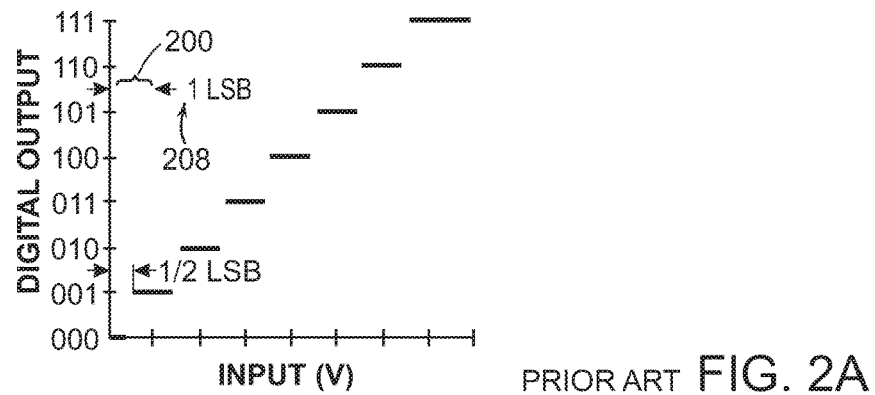
PRIOR ART FIG. 2A
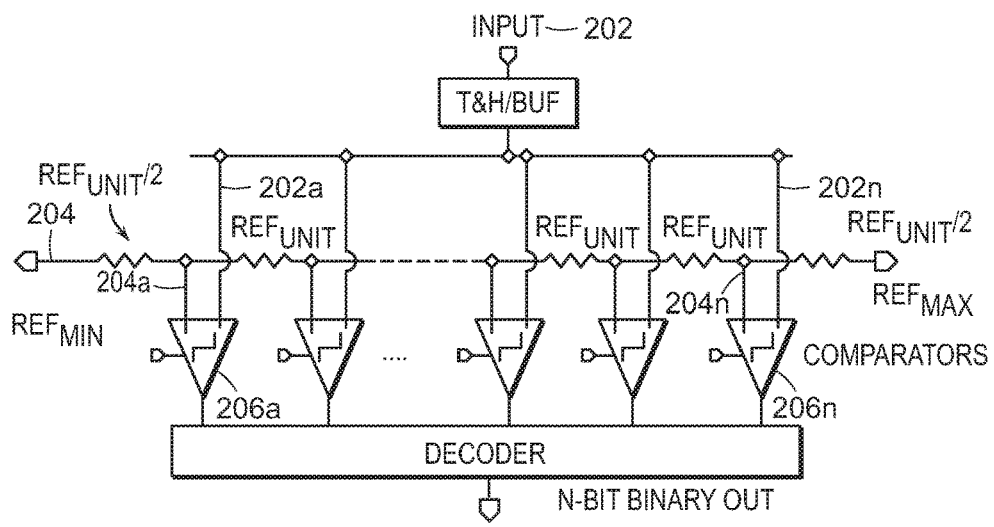
PRIOR ART FIG. 2B

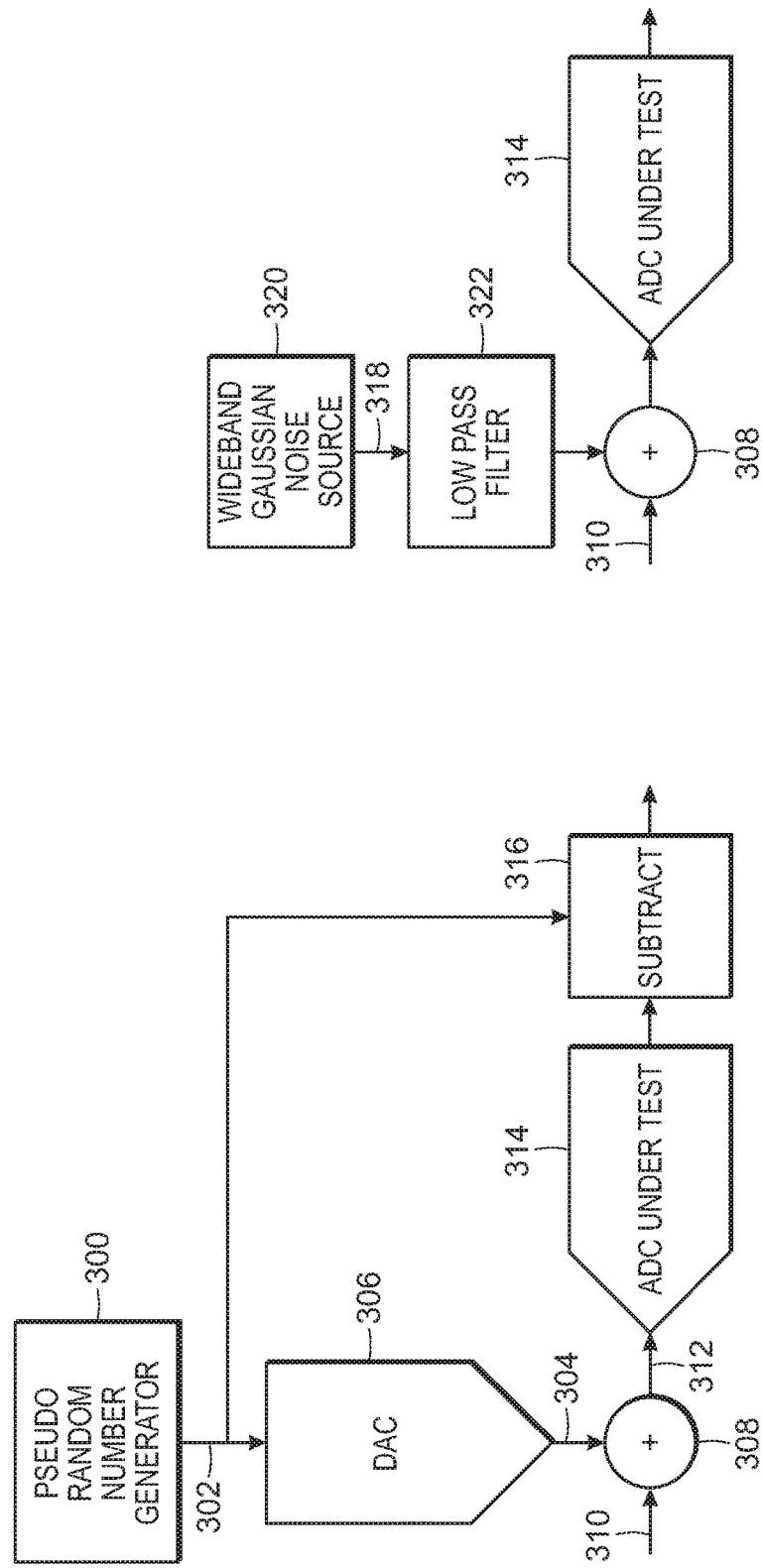

COMPLETE COMPLEMENTARY CODE PARALLEL OFFSETS

TECHNICAL FIELD

The present disclosure relates generally to the analog-to-digital conversion, and more specifically, to linearization through dithering.

BACKGROUND

High performance analog-to-digital converters (ADCs) are now widely used in many applications, including RF receivers (e.g., radar) and electronic countermeasures, communication systems, test instrumentation and others, that handle large dynamic ranges of signal amplitudes of a high data rate signals.

Dynamic specifications for ADCs are typically expressed in the frequency domain, using Fast Fourier Transforms (FFTs) to derive the specifications. With reference to FIG. 1, an example fundamental input signal 100 is shown at its carrier frequency 102, and its power amplitude 104 is shown as less than the full scale range 106 of the associated ADC, providing headroom 108, which is important to avoid clipping of the input signal in the case of offsets from the ADC or input signal generator. Spurious-free dynamic range (SFDR) 110 of the ADC is often defined as the distance in dB from the fundamental input signal 100 peak amplitude 104 to the peak spur level 112 in the output frequency spectrum, which could represent noise and is not necessarily limited to harmonic components of the analog input signal 100. An average noise floor 114 may be derived from both the average noise of the ADC and the FFT operation itself. The noise performance of the ADC is expressed as signal-to-noise ratio, or SNR=6.02n+1.76+10 log(m/2), where n=ADC resolution, and in =FFT points, and the signal is the rms (root mean square) power of the fundamental input signal 100, and the noise is the rms sum of all non-fundamental harmonics in the Nyquist band, excluding DC. For a given sampling frequency, fs, the theoretical rms quantization noise in the bandwidth of input frequencies from DC to fs/2 is given as q/√n, where q is the weight of the ADC's least significant bit (LSB) and n is the number of bits.

Two fundamental limitations to maximizing SFDR in a high-speed ADC are the distortion produced by its front end electronics (i.e., amplifier and sample-and-hold circuit) and that produced by nonlinearity in the transfer function of the encoder portion of the ADC. While little can be done externally to the ADC to significantly reduce the inherent distortion caused by its front end, differential nonlinearity (DNL) in the ADC's encoder transfer function can be reduced by the proper use of external techniques. With reference to FIGS. 2A and 2B, DNL error is generally defined as the difference between an actual transfer function step width 200 (e.g., resulting from comparison of the input signal 202 to a precise reference voltage 202a provided by a reference voltage ladder 204 at a comparator circuit 206a as shown in FIG. 2B) and the ideal value of 1 LSB 208 as shown in FIG. 2A, and is often due to mismatches in the ADC's resistance ladder 204 providing threshold reference voltages 204a-204n and its comparator circuits 206a-206n (in a typical 12-bit ADC, a linear voltage step, 1 LSB, is approximately 250 mV).

A well-known technique called dithering is often utilized to maximize SFDR. Dithering is the process of adding an uncorrelated signal, such as pseudo random noise (PRN) or broadband noise, to a desired analog signal prior to the analog input gate of the ADC. Although the injected dither does not eliminate the errors, it randomizes the DNL errors of the ADC, thereby eliminating the concentration of DNL errors at a small number of codes. This technique improves the resolution and linearity of the conversion by effectively smoothing the quantization errors of the ADC's transfer function. However, while spurs are reduced, a commensurate increase in the noise floor occurs. Many conventional systems simply accept degradation of the noise floor, sub-optimizing SFDR to avoid the additional noise. FIG. 3A illustrates a prior art embodiment of a SFDR maximization, wherein a PRN generator 300 generates a random digital signal 302 that is converted to an analog dither signal 304 by a high dynamic range digital-to-analog converter (DAC) 306 coupled to a summer 308, which adds the analog dither signal 304 to an analog input signal 310 before the dithered analog signal 312 is digitized by ADC 314. The random digital signal 302 is subtracted from the converter response at digital subtractor 316.

FIG. 3B shows another common technique for spur reduction, wherein a wideband non-correlated signal 318 is generated using a thermal noise source 320, and then added to the analog input signal 310 by a summer 308. Depending upon on how much noise must be injected, SNR of the ADC 314 may be unduly sacrificed. In this technique, adding noise that is not in the same band as the input signal 310 is important, as otherwise, the benefits of the dithering are at least partially lost. In order to ensure this for most applications, the wideband dither noise 318 may be low-pass filtered 322 so as not to encroach on the frequency band of the input signal 310.

The effect of quantization noise is even more pronounced in broadband data converters. Wider ADC operating bands result in more thermal noise being integrated and impacting dynamic range. Monobit ADCs can provide very wide bandwidth and excellent SFDR but a single monobit has limited dynamic range due to quantization noise. A "sum of monobits" architecture uses M monobits (M being a user selected number), to overcome this limitation. A problem similar to DNL arises if the DC offsets of the respective monobits are not all equal. The sum of monobits architecture splits the incoming analog signal into M paths each of which is summed with unique analog dither, each dither source being independent from the other dither sources, each sum is provided to one of the M monobit ADCs whose outputs are summed to digital number. To ensure high linearity large amounts of dither are used (can exceed 50% of the dynamic range of a given monobit ADC. The large dither reduces spurs to very low levels but adds large amounts of random noise to the sum. Ideally M monobits achieve a $2^{(M-1)}$ dynamic range but this is not usually achieved in real-world circuits. The analog noise imparted by the large dithers can reduce the dynamic range by several integer factors.

SUMMARY

The present disclosure describes embodiments of improved architectures and techniques for linearizing quantization of an input RF signal through the application of low-cost complementary analog codes and noise to a parallel array of quantizers, such as mono-bit ADCs.

In one embodiment, an analog to digital data conversion system for converting an analog input signal is provided, including a plurality of ADCs arranged in a parallel configuration and a complementary code generator coupled to each of the ADCs and operational to generate a plurality of pseudo-random discrete valued complementary offset voltage levels that span the input voltage range of the sum of the plurality of ADCs. The generator also generates an amount of continuous, analog noise less than steps between the discrete offset voltage levels that randomly varies at values between the discrete voltage offset levels. In some cases, a separate amount of continuous analog dither is generated for, and coupled to, each of the ADCs. Both the discrete offset and the analog noise are added to the input to each ADC. Each ADC quantizes the respectively coupled analog input responsive to the respectively coupled discrete offset voltage level and the continuous analog noise to obtain a digital output, and a combiner coupled to respective outputs of the ADCs operates to combine the respective digital outputs to obtain a linearized digital representation of the analog input signal. In a preferred embodiment, the ADCs comprise mono-bit ADCs. In another embodiment the mono-bit ADCs are configured in pairs in differential linear monobit circuits.

In one embodiment, the discrete offset voltage levels are uniform in distribution, and are complementary in that they sum to a constant value across all of the ADCs in the arrangement of ADCs.

In another embodiment, coupling the discrete offset voltage levels and analog noise (dither) comprises coupling N discrete offset voltage levels to N independent ADCs. In an alternative embodiment, the coupling is effected through differentially coupling N/2 discrete offset voltage levels N/2 mono-bit quantizers in a differential linear mono-bit ADC configuration.

In another embodiment, generating the complementary discrete offset voltage levels comprises generating a digital offset code sequence with a pseudorandom number generator, inverting a distinct bit of the digital dither code sequence to form a plurality of complementary codes, and inputting the plurality of complementary codes into a corresponding plurality of DACs. This enables configurations wherein the number of ADCs in the plurality of ADCs exceeds the number of DACs in the plurality of DACs.

In yet another embodiment the N codes input to the N ADCs are mutually independent.

In yet another embodiment, generating the continuous analog noise comprises adjusting the gain applied to the continuous analog noise, and/or uniform analog dither signals or Gaussian analog dither signals.

In another aspect, the combiner may average the digital outputs from the plurality of ADCs, and subtract therefrom the constant sum of the discrete offset voltage levels.

In another embodiment, coupling the discrete offset voltage levels and the continuous analog noise with the input signals to the respective ADCs is achieved by coupling such that on different clock cycles, at least one discrete offset voltage level is coupled to a different one of the ADCs than the ADC the at least one discrete voltage level was coupled to on the prior clock cycle.

The foregoing and other features and advantages of the embodiments will be apparent from the following more particular description, as illustrated in the accompanying figures of the drawing.

BRIEF DESCRIPTION OF THE FIGURES

The present disclosure is further described in reference to the noted plurality of figures by way of non-limiting examples of embodiments, in which like reference numerals represent similar parts throughout the several views of the figures, wherein:

FIG. 1 is a plot of an exemplary FFT output for characterizing an ADC;

FIGS. 2A and 2B illustrate, respectively, a plot of a typical "stair case" transfer function of an ADC, and a circuit diagram of a conventional quantizer;

FIGS. 3A and 3B are schematic circuit diagrams of example prior art embodiments of dithered analog to digital conversion systems;

DETAILED DESCRIPTION

The details described and illustrated herein are by way of example and for purposes of illustrative description of the exemplary embodiments only, and are presented to provide what is believed to be the most useful and readily understood description of the principles and conceptual aspects of the disclosure. In this regard, no attempt is made to show structural details of the subject matter in more detail than is necessary for the fundamental understanding of the disclosure. The description taken with the drawings make apparent to those skilled in that how the several forms of the present disclosure may be embodied in practice with additional components or steps and/or without all of the components or steps that are described. Further, like reference numbers and designations in the various drawings indicate like elements.

Figure 4A:
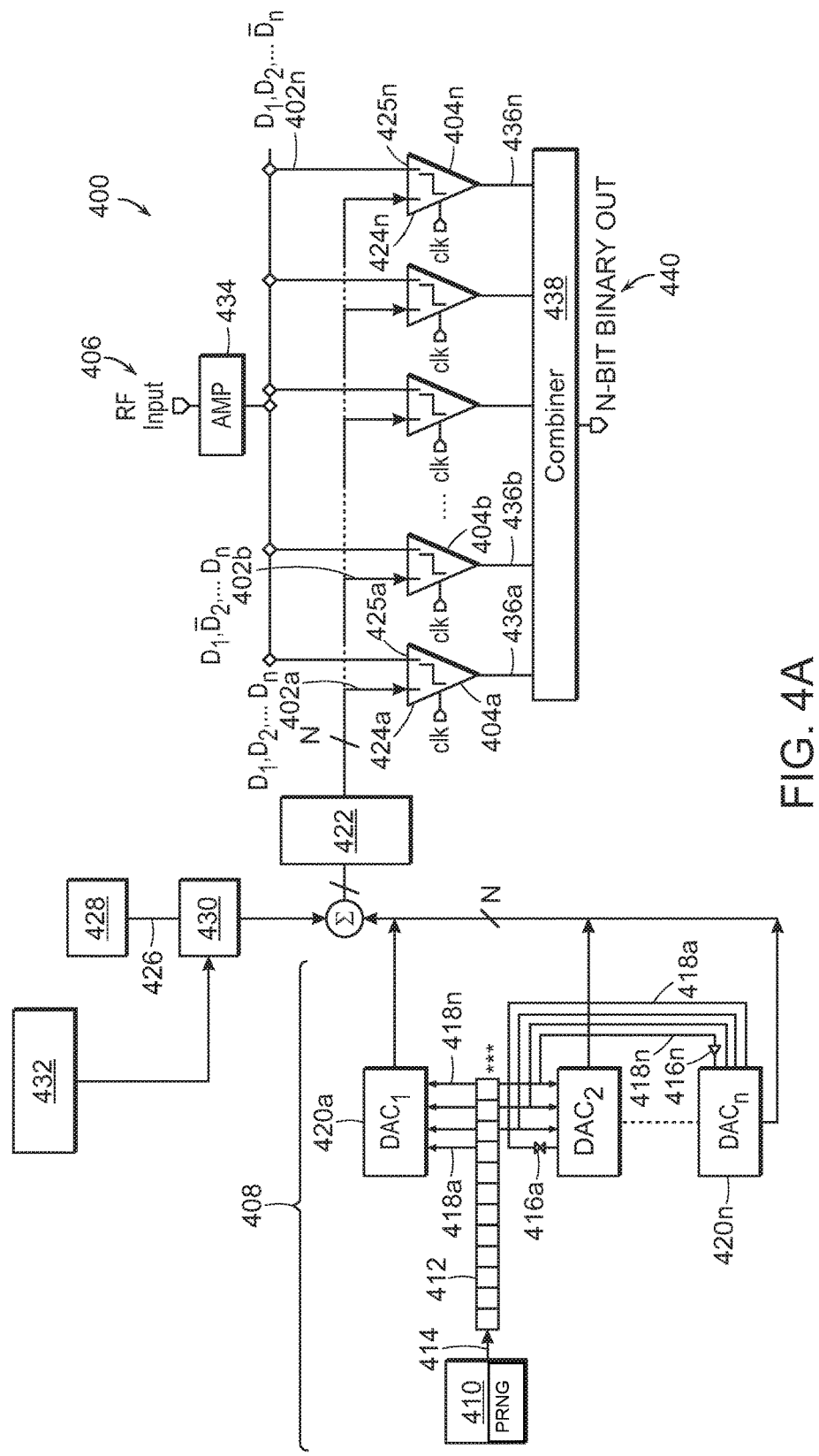
FIGS. 4A and 4B are schematic circuit diagrams of exemplary analog to digital conversion systems in accordance with an embodiment of the disclosure.

FIG. 4A shows a schematic diagram of a conversion system 400 in accordance with an exemplary multi mono-bit architecture embodiment of the present disclosure. System 400 provides N discrete valued, independent, and complementary codes $D_1$-$D_N$ 402a-402n, each code randomly varying an offset voltage level of uniform distribution, to N corresponding quantizers (1 bit or greater) arranged in parallel, such as mono-bit ADCs 404a-404n, in order to linearize (i.e., reduce the size and number of spurs of) the quantization of an RF input signal 406 in a manner less costly than conventional dithered quantization. Complementary means that all codes sum to the same constant value or zero at any time. At any sample time each ADC receives a different offset code, each code taking on one of the values uniformly spaced across the input voltage range. Generally, summing digital outputs of multiple mono-bit ADCs reduces noise, but the performance of the combination typically depends on factors including the nature of the dither signal versus input signal level, any relative DC offsets present in the individual mono-bit ADCs, and the independence of the dither signals. In the disclosed embodiments, quantizing the RF input signal 406 with the complementary codes 402a-402n spreads the effect of the input signal's interaction with the ADCs 404a-404n, reducing the measurement system's imperfections, with practically no loss in headroom. Replacing conventional large-scale (20 dB dither to noise ratio) dither with the discrete set of complementary analog offsets $D_1$-$D_N$ 402a-402n results in very high linearity at a superior noise level compared to previous analog to digital conversion systems.

As illustrated, system 400 includes a complementary code generator 408 comprised of a single pseudorandom number generator (PRNG) 410 coupled to a shift register 412 receiving random digital PRNG codes 414 from PRNG 410. The digital PRNG codes 414 are output from shift register 412 and passed through a corresponding set of inverters 416a-416n in order to flip bits of the digital PRNG codes 414, such that a set of N complementary digital codes 418a-418n are fed to a plurality of digital to analog converters DACs 420a-420n. DACs 420a-420n convert the digital codes 418a-418n into the set of complementary analog codes $D_1$-$D_N$ 402a-402n, which comprise discrete voltage offsets that uniformly span the dynamic range of the sum of the analog converters DACs 420a-420n and that will be used for quantization of input signal 406. The analog codes $D_1$-$D_N$ 402a-402n are complementary in that, at any time interval, their sum is always equal to a constant value (which may be zero) across all of the mono-bit ADCs. As shown in FIG. 4A, complementary code generator 408 includes PRNG 410, shift register 412, inverters 416a-416n, and DACs 420a-420n. However, it should be understood that each of those elements could be separate from generator 408 in various embodiments of system 400.

In one embodiment, each of the complementary codes $D_1$-$D_N$ 402a-402n is coupled to a corresponding one of the ADCs 404a-404n. In an alternate embodiment, the complementary offset codes $D_1$-$D_N$ 402a-402n are randomized at randomizer 422 such that, on each clock cycle, each of the complementary codes 418a-418n is randomly provided to the same or a distinct one of the ADCs 404a-404n at its associated one of first inputs 424a-424n, but at least one of the codes is provided to a different ADC than on the previous clock cycle. The goal of randomizer 422 is to reduced distortions caused by mismatches in the parallel array of ADCs 404a-404n by random or pseudo-random coupling.

A continuous analog noise signal 426, which preferably comprises Gaussian or uniform distribution noise, is added in an optimal amount to the complementary analog codes $D_1$-$D_N$ 402a-402n. The continuous analog noise signal 426 may be generated by analog noise source 428 (e.g., a thermal noise diode, etc.) and gain adjusted by amplifier circuit 430 and gain control logic 432. The analog noise signal 426 is added in such amounts, less than the discrete analog code offset levels, that noise values fill in gaps between the discrete offset levels of the analog codes $D_1$-$D_N$ 402a-402n, providing a fully uniform distribution of all voltage levels prior to quantization. While augmenting with uniform noise is preferred, Gaussian noise may also be used. In either case, the added analog noise (dither) signal 426 represents a much smaller level than used in prior systems. The analog noise signal 426 is shown as being added prior to randomization by randomizer 422, however in an alternate embodiment it may be added to complementary analog codes $D_1$-$D_N$ 402a-402n after randomization, such that a different, independent analog noise is added to each of the N codes.

Input signal 406 may be amplified at an amplifier circuit 434 prior to being provided to each of the second inputs 425a-425n of each of the ADCs 404a-404n. The ADCs 404a-404n quantize the input signal using the sum of the discrete offset voltages levels of the complementary codes $D_1$-$D_N$ 402a-402n and the continuous analog noise signal 426 and generate digital outputs 436a-436n that are combined at combiner 438 to obtain an N-bit binary output 440 that is a linearized digital representation of the analog input signal 406. Combiner 438 may average the digital outputs 436a-436n and then subtract the constant value to which the codes complementary analog codes $D_1$-$D_N$ 402a-402n sum is subtracted from the averaged digital outputs 436a-436n. Thus, the complementary codes $D_1$-$D_N$ 402a-402n provide most of the "dither effect", but cancel on every clock cycle/sample, leaving a small noise due the continuous analog "filler" noise signal 426 to affect SNR.

The sum of the mono-bit ADCs 404a-404n has much lower quantization noise than a single mono-bit ADC and retains very high linearity. Prior sums of monobits required many more individual mono-bits to achieve the same SNR and did not achieve as high a linearity. Whereas dither adds to the noise level of the system unless it can be removed, the complementary offsets add no noise and consume no headroom nor part of the dynamic range of a quantizer. System 400 can achieve up to 34 dB better SFDR, with a system noise figure that is several dB better than previous systems. This advantageously enables design choices such as achieving similar performance with fewer mono-bit ADCs, or operating with higher performance (e.g, lower implementation loss in SNR between ADC input and output.)

Each of the sections of conversion system 400 may be coupled together using any of a variety of coupling means such as an electrical circuit, a communication bus, or another type of coupling means. One or more of the sections of the conversion system 400 may be combined (e.g., integrated together). The system 400 may configure the parallel array of mono-bit ADCs 404a-404n packaged in a single integrated circuit (IC) chip, with or without any or all of the other sections. Any of the sections not included within the IC chip may be coupled to the IC chip. The IC chip may include one or more input pins/terminals and/or one or more output pins/terminals for coupling the IC chip to the sections not included within the IC chip.

Figure 4B:
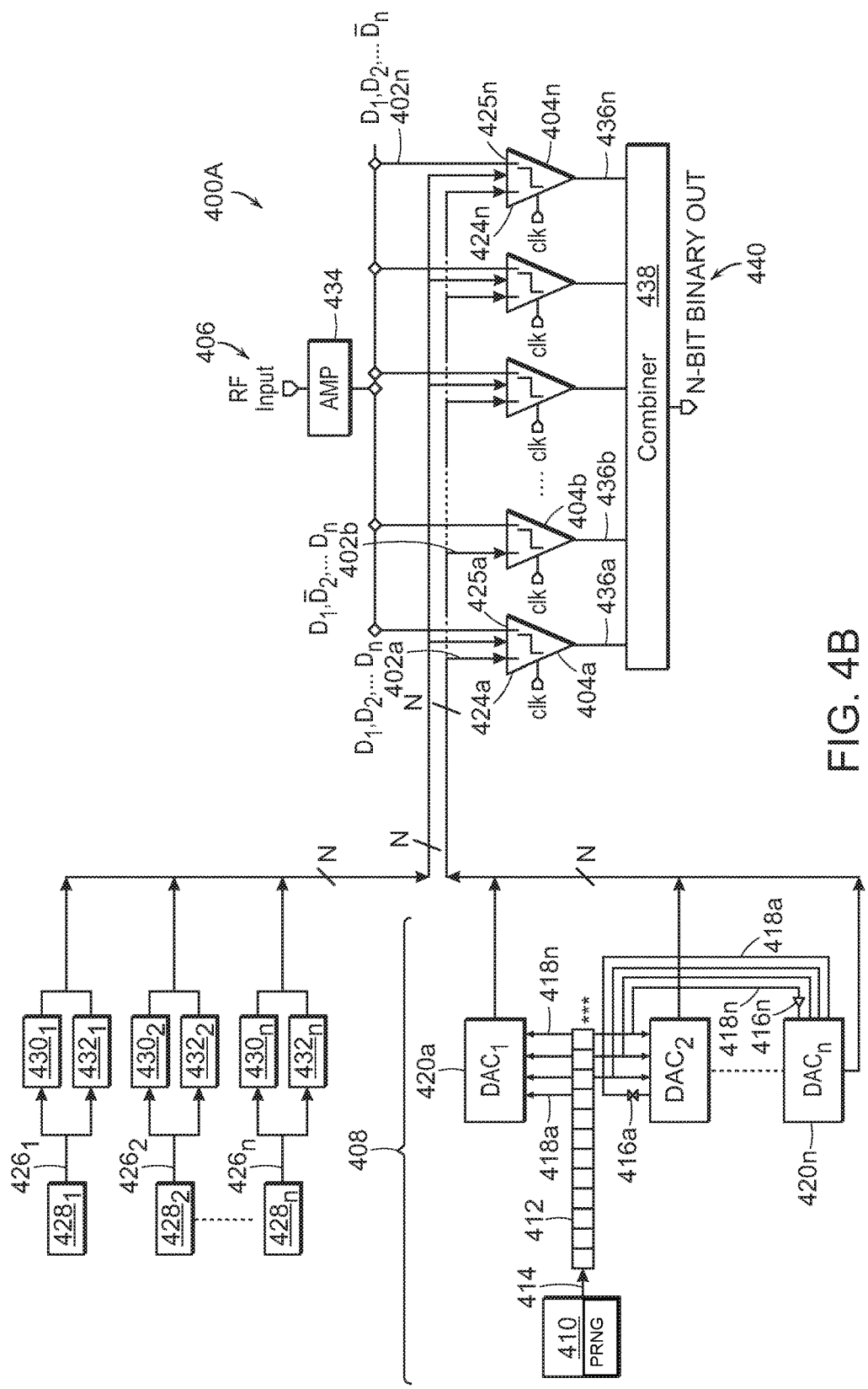

Turning to FIG. 4B, a separate embodiment of the system 400 is shown at 400A. The system 400A is similar to the system 400, except that like the complementary codes $D_1$-$D_N$ 402a-402n, the analog dither is independently produced for each ADC 404a-404n. To that end, analog noise signals $426_1$-426n are generated for each ADC 404a-404n. This can be accomplished by including an analog noise source $428_1$-428n (e.g., a thermal noise diode, etc.) corresponding and coupled to each ADC 404a-404n. Each analog noise signal 426a-426n can further be optionally gain adjusted by an independent amplifier circuit $430_1$-430n and gain control logic $432_1$-432n.

Figure 5A:
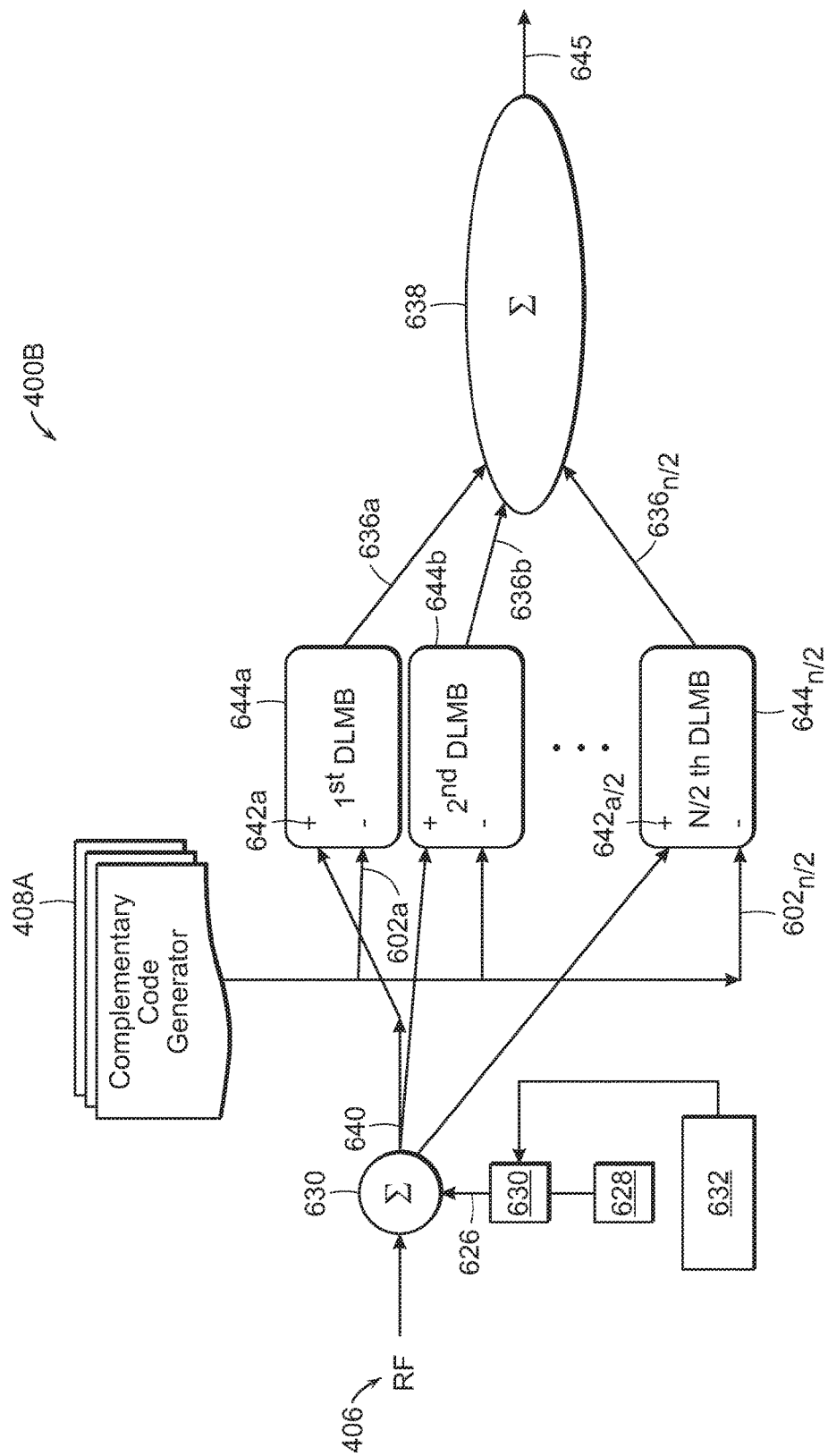
FIGS. 5A and 5B are alternative embodiments of a conversion system in accordance with the disclosure.

A portion of a conversion system 400B that comprises an alternative embodiment of conversion system 400 is depicted in FIG. 5A. Complementary code generator 408A generates N/2 complementary discrete analog codes $D_1$-$D_{n/2}$ 602a-602n/2 randomly varying the offsets, which are random and of uniform distribution, to N/2 different offset levels. Reducing the number of discrete analog codes utilized results in a commensurate reduction in the number of DACs required.

A continuous analog noise signal 626, which preferably comprises a Gaussian or a uniform distribution noise, is in this embodiment added by an combiner 631 in an optimal amount to the analog RF input signal 406 to form a noise augmented input signal 640. The continuous analog noise signal 626 may be generated by analog noise source 628 (e.g., a thermal noise diode, etc.) and gain adjusted by amplifier circuit 630 and gain control logic 632. The analog noise signal 626 is added in such amounts, less than the discrete analog code offset levels, that noise values fill in gaps between the discrete offset levels of the analog codes $D_1$-$D_{n/2}$ 602a-602n/2 providing a fully uniform distribution of all voltage levels prior to quantization. The noise augmented input signal 640 is provided for quantization at respective first inputs 642 to a set of N/2 differential linear mono-bit DLMB circuits 644a-644$_{n/2}$ arranged in parallel.

Figure 5B:
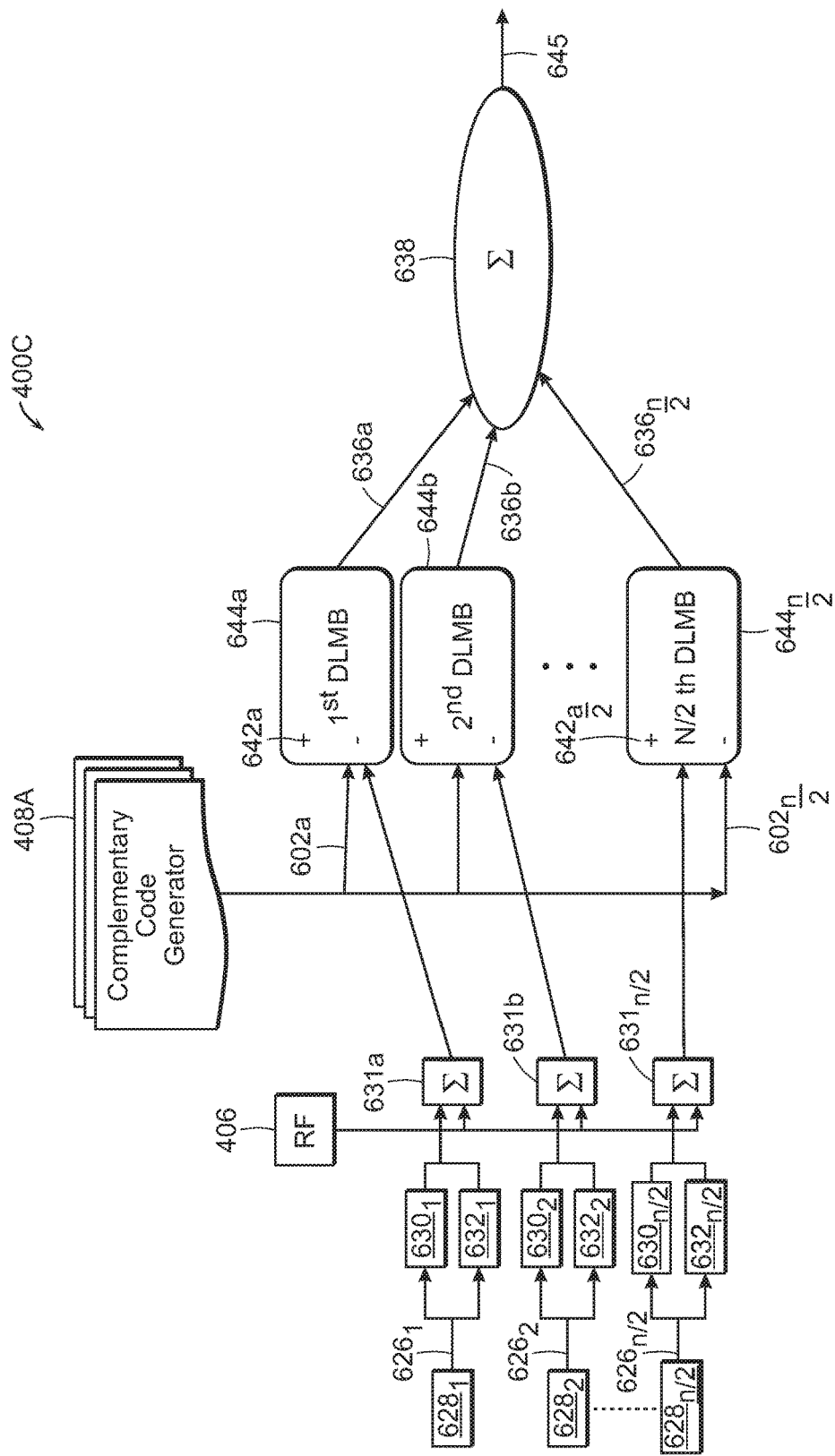

Turning to FIG. 5B, a separate embodiment of the system 400B is shown at 400C. The system 400C is similar to the system 400B, except that the analog dither is independently produced for each DLMB circuit 644a-644$_{n/2}$. This can be accomplished by including an analog noise source 628$_1$-628$_{n/2}$ (e.g., a thermal noise diode, etc.) corresponding and coupled to each DLMB circuit 644a-644$_{n/2}$ to provide analog dither signals 626$_1$-626$_{n/2}$. Each analog noise signal 626$_1$-626$_{n/2}$ can further be optionally gain adjusted by an independent amplifier circuit 630$_1$-630$_{n/2}$ and gain control logic 632$_1$-630$_{n/2}$. The analog dither signals 626$_1$-626$_{n/2}$ can then be combined with the RF signal 406 in respective combiners 631a-631$_{n/2}$ before being provided to respective DLMB circuits 644a-644$_{n/2}$ arranged in parallel.

Figure 5C:
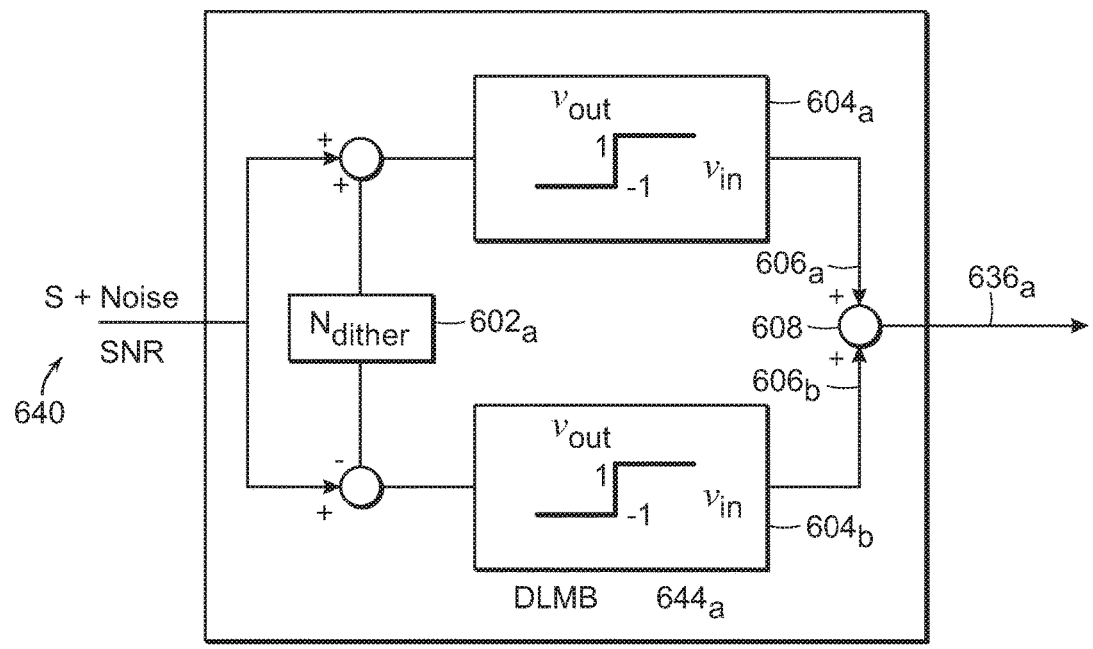
FIG. 5C is a circuit diagram of an exemplary differential linear monobit (DLMB) architecture such as used in the embodiment, and FIG. 5D are comparative transfer function plots of a no dither and dithered technique contrasted with an ideal ADC response.
Figure 5D:
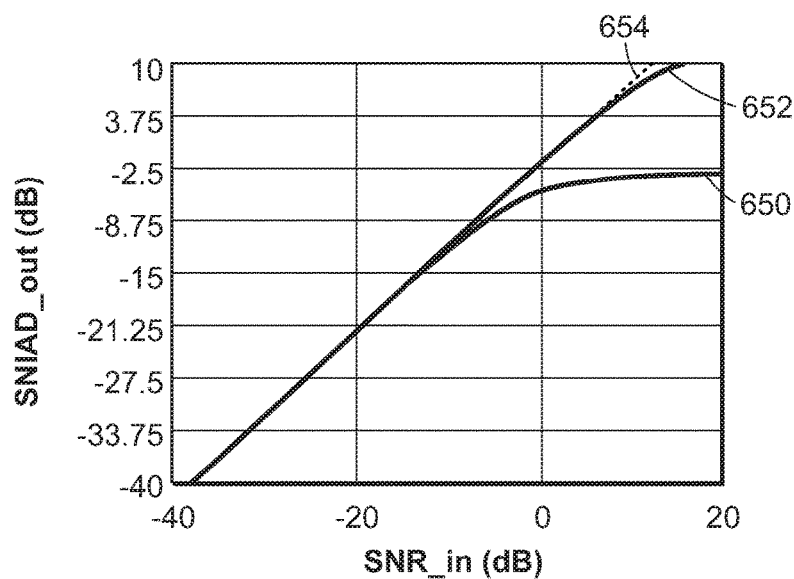

An exemplary DLMB circuit 644a is illustrated in FIG. 5C, wherein a pair of parallel quantizers, such as mono-bit ADCs 604a and 604b, are fed the noise augmented signal 640 and differentially fed a respective one of the N/2 complementary discrete analog codes $D_1$-$D_{n/2}$ 602a-602n/2. The quantized outputs 606a and 606b of the ADCs 604a and 604b are summed at combiner 608, resulting in a digital output 636a wherein the differential dither is coherently cancelled. As shown in the example results of FIG. 5D, inverting the complementary analog codes $D_1$-$D_{n/2}$ 602a-602n/2 extends the linear ranges of the mono-bit ADCs 604a and 604b to higher input SNRs, i.e., from a no applied dither response 650, to a 10 dB applied dither response 652, which is clearly much closer to an ideal linear ADC response 654.

With reference again to FIGS. 5A-5B, the respective digital outputs 636a-636$_{n/2}$ are combined at a combiner 638 to obtain an N-bit binary output 645 that is a linearized digital word representation of the analog input signal 406. Combiner 638 may sum or average the digital outputs 636a-636n and then subtract the constant value to which the codes complementary analog codes $D_1$-$D_{n/2}$ 602a-602n/2 sum is subtracted from the averaged digital outputs 636a-636$_{n/2}$.

Simulated Experimental Results and Analyses

Figure 6A:
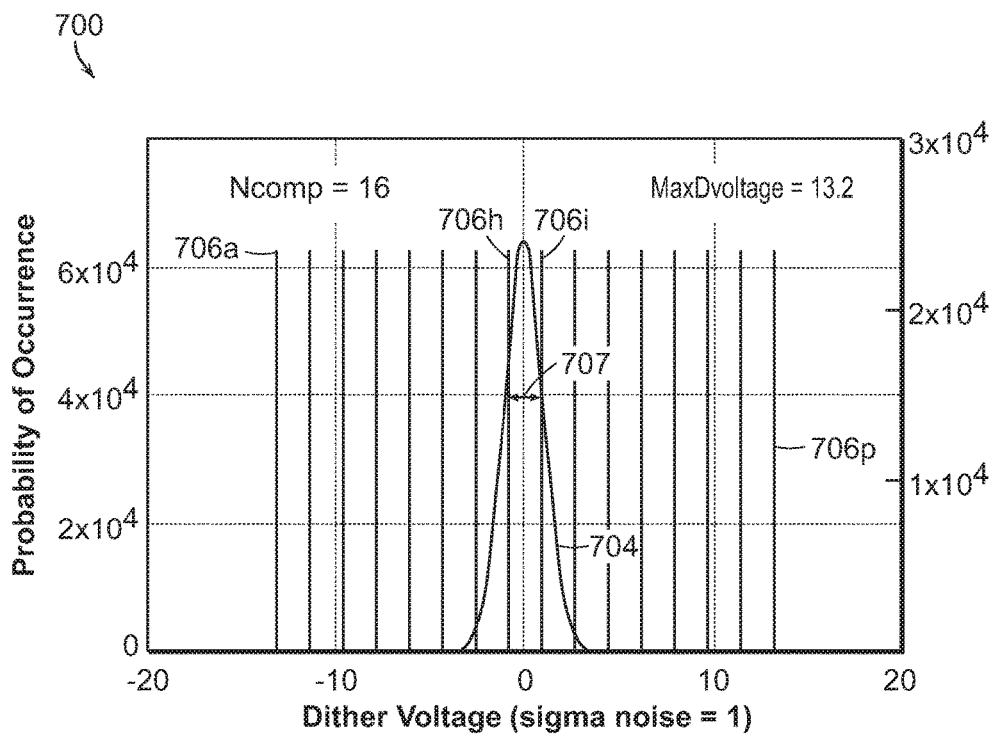
FIGS. 6A and 6B are histograms plots for signals including analog code plus dither of an exemplary embodiment.
Figure 6B:
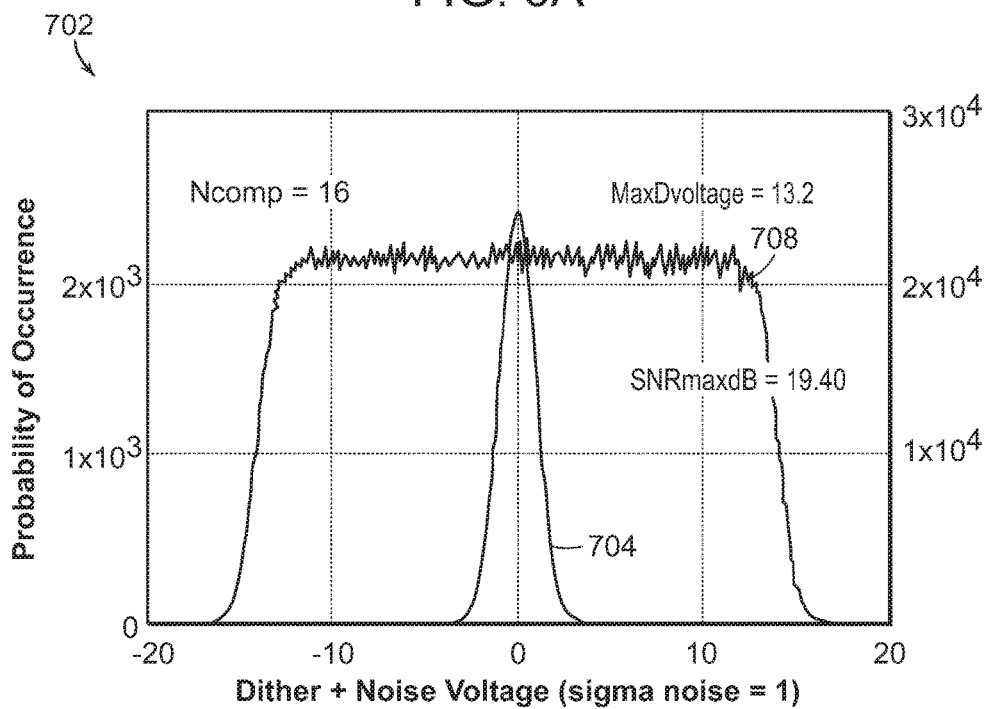

FIGS. 6A-6B illustrate exemplary histograms 700, 702 associated with signal analyses that might be used in estimating a maximum SNR for a 16 mono-bit ADC embodiment of conversion system 400. Notably, all values presented below with respect to FIGS. 6A-6B are exemplary values and can vary in different embodiments of the subject application. Each histogram 700, 702 plots relative levels of continuous analog noise 704 added to the dither (complementary analog codes 706a-706p) and demonstrates how the analog noise signal 704 has been gain adjusted to the point that it "fills" a gap 707 between two complementary analog codes 760h and 706i. Histogram 700 comprises a histogram of the complementary analog codes 706a-706p, and histogram 702 represents a histogram of an exemplary the analog code plus dither noise signal 708. A maximum SNR for the example architecture may be estimate by $$SNR = \frac{A^2}{2\sigma_{noise}^2}$$

where A is the RF input signal amplitude, a noise is referenced to 1 Volt. The signal amplitude A is set to a maximum equal to the maximum dither voltage, and the SNR may then be calculated. In the example shown, the maximum dither voltage is 12.2 V, yielding a maximum SNR of 19.4 dB. Table One shows the maximum SNRs, implementation losses, and SFDR achieved utilizing various numbers of mono-bit ADCs.

TABLE ONE

| Mono-bit ADCs | Max SNR (dB) | Imp. Loss (dB) | SFDR |
|---|---|---|---|
| 32 | 25.7 | 1.28 | >85 |
| 16 | 19.4 | 1.25 | >85 |
| 8 | 12.8 | 4.5 | 63 |
| 4 | 5.4 | 4.6 | 50 |

Figures 7A, 7B, 7C, 7D:
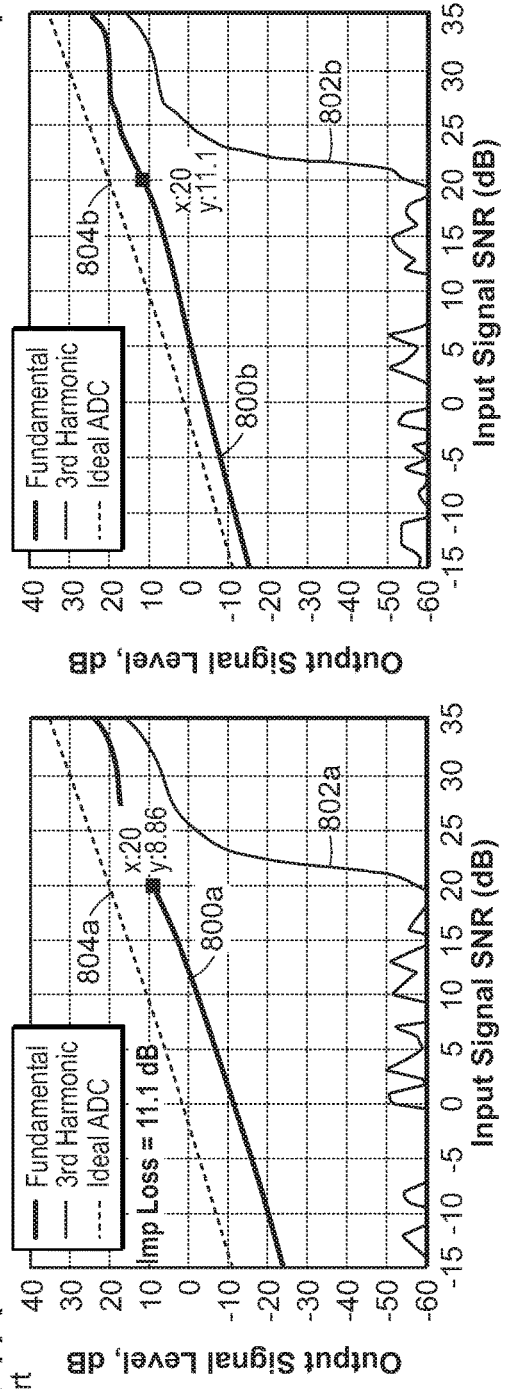
FIGS. 7A-7D are system performance results plotted for two conventional dithered linearization embodiments and two complementary code offset techniques applied in an accordance with the present disclosure.

FIGS. 7A-7D present comparative performance results of distinct quantization linearization techniques for a 16 mono-bit ADC conversion system embodiment. In each figure, the input signal fundamental response 800a-800d, 3rd input signal harmonic 802a-802d and ideal ADC response 804a-804d are plotted. FIGS. 7A and 7B represent results from conventional linearization techniques of using random uniform dither on parallel mono-bit ADCs, and on parallel DLMBs, respectively, with a dither to noise ratio (DNR) of 20. FIG. 7C represents use of a complementary code technique in accordance with the present disclosure, where DNR=20 and a first level complementary dither is utilized. FIG. 7D represents use of full complementary code offsets, where the average code voltage variation is 18 dB above nose (shown as DNR=18). Each chart shows the associated effective number of bits (ENOB) achieved by the associated quantization linearization technique. ENOB is a specification that relates measurement or generation performance of a device to a common specification used in data converters: bits of resolution. Most data converters are designed to perform at a particular speed and resolution. An ENOB of 2.8 for a 3-bit ADC would be considered highly performing. The SFDR resulting from each technique is reflected as the largest spread between the input signal fundamental responses 800a-800d and the 3rd input signal harmonics 802a-802d. All ADCs degrade the associated system's noise floor. Implementation loss, reflected as the gaps between the SNR at input to the ADC and the SNR at the output of the ADC. Balancing total system performance with ADC complexity, the ideal ADC responses 804a-804d and the input signal fundamental responses 800a-800d, is consider near optimal at approximately 1 dB of implementation loss. A smaller loss can be achieve by increasing gain prior to the signal being quantized but in many applications this is not a good trade off. The slopes of the 3rd input signal harmonics 802a-802d represent an important measure of system performance. It is readily apparent from FIG. 7D that use of fully complementary code offsets achieves >80 dB SFDR 806, with nearly ideal quantization noise relative to system noise, and a very high ENOB.

Various embodiments of the above-described systems and methods may be implemented in digital electronic circuitry and/or firmware. Method steps can be performed by one or more programmable processors and/or controllers executing a computer program to perform the disclosed techniques by operating on input data and generating output. Method steps can also be performed by, and an apparatus can be implemented as, special purpose logic circuitry.

Whereas many alterations and modifications of the disclosure will no doubt become apparent to a person of ordinary skill in the art after having read the foregoing description, it is to be understood that the particular embodiments shown and described by way of illustration are in no way intended to be considered limiting. Further, the subject matter has been described with reference to particular embodiments, but variations within the spirit and scope of the disclosure will occur to those skilled in the art. It is noted that the foregoing examples have been provided merely for the purpose of explanation and are in no way to be construed as limiting of the present disclosure.

What is claimed is:

1. A method of converting an analog input signal to a digital output signal, comprising:
 coupling an analog input signal to a plurality of analog-to-digital converters (ADCs) arranged in a parallel configuration;
 generating a plurality of pseudo-random discrete valued complementary offset voltage levels that span an input voltage range of the sum of the plurality of ADCs;
 generating an amount of continuous analog dither that randomly varies at values between the discrete offset voltage levels, the continuous analog dither being less than steps between the discrete offset voltage levels;
 coupling the discrete offset voltage levels and the analog dither with the input signal to the respective ADCs in the plurality of ADCs such that on different clock cycles, different discrete offset voltage levels are coupled to at least some of the ADCs;
 quantizing, at each ADC, the respectively coupled analog input responsive to the respectively coupled discrete offset voltage level and the continuous analog dither to obtain a digital output; and
 combining the respective digital outputs from the ADCs to obtain a linearized digital representation of the analog input signal.

2. The method of claim 1, wherein the ADCs comprise mono-bit ADCs.

3. The method of claim 1, where the discrete offset voltage levels are uniform in distribution.

4. The method of claim 1, wherein the discrete offset voltage levels sum to a constant value across all of the ADCs in the plurality of ADCs.

5. The method of claim 1, wherein coupling the discrete offset voltage levels and analog dither further comprises coupling N discrete offset voltage levels to N independent mono-bit ADCs.

6. The method of claim 1, wherein coupling the discrete offset voltage levels and analog dither further comprises differentially coupling N/2 discrete offset voltage levels to N/2 mono-bit quantizers in a differential linear mono-bit ADC configuration.

7. The method of claim 1, wherein generating the complementary discrete offset voltage levels comprises:
 generating a digital offset code sequence with a pseudo-random number generator;
 inverting a distinct bit of the digital dither code sequence to form a plurality of complementary codes; and
 inputting the plurality of complementary codes into a corresponding plurality of digital to analog converters (DACs).

8. The method of claim 7, wherein the number of ADCs in the plurality of ADCs exceeds the number of DACs in the plurality of DACs.

9. The method of claim 1, wherein generating the continuous analog dither comprises adjusting gain applied to the continuous analog dither.

10. The method of claim 1, wherein generating the continuous analog dither comprises adding uniform analog dither signals or Gaussian analog dither signals.

11. The method of claim 1, wherein combining comprises:
 summing the digital outputs from the plurality of ADCs; and
 subtracting therefrom a sum of the discrete offset voltage levels.

12. The method of claim 1, wherein in the step of generating a plurality of pseudo-random discrete valued complementary offset voltage levels, each offset voltage level is mutually independent.

13. The method of claim 1, wherein coupling discrete offset voltage levels and the analog dither with the input signals to the respective ADCs in the plurality of ADCs comprises coupling such that on different clock cycles, at least one discrete offset voltage level is coupled to a different one of the ADCs than the ADC the at least one discrete offset voltage level was coupled to on the prior clock cycle.

14. The method of claim 1, wherein a separate amount of continuous analog dither is generated for, and coupled to, each of the ADCs.

15. An analog to digital conversion system, comprising:
 a plurality of analog-to-digital converters (ADCs) arranged in a parallel configuration;
 an analog input signal coupled to an input of each of the ADCs;
 a complementary code generator coupled to each of the ADCs and operational to generate a plurality of pseudo-random discrete valued complementary offset voltage levels that span an input voltage range of the sum of the plurality of ADCs;
 wherein the generator generates an amount of continuous analog dither that randomly varies at values between the discrete offset voltage levels, the continuous analog dither being less than steps between the discrete offset voltage levels;
 wherein each ADC quantizes the respectively coupled analog input responsive to the respectively coupled discrete offset voltage level and the continuous analog dither to obtain a digital output; and
 a combiner coupled to respective outputs of the ADCs and operational to combine the respective digital outputs to obtain a linearized digital representation of the analog input signal.

16. The system of claim 15, wherein the ADCs comprise mono-bit ADCs.

17. The system of claim 15, where the discrete offset voltage levels are uniform in distribution.

18. The system of claim 15, wherein the discrete offset voltage levels sum to a constant value across all of the ADCs in the plurality of ADCs.

19. The system of claim 15, wherein coupling the discrete offset voltage levels and analog dither further comprises coupling N discrete offset voltage levels to N independent mono-bit ADCs.

20. The system of claim 15, wherein coupling the discrete offset voltage levels and analog dither further comprises differentially coupling N/2 discrete offset voltage levels to N/2 mono-bit quantizers in a differential linear mono-bit ADC configuration.

21. The system of claim 15, wherein the complementary code is operational to generate the complementary discrete offset voltage levels by:

generating a digital offset code sequence with a pseudo-random number generator;
inverting a distinct bit of the digital dither code sequence to form a plurality of complementary codes; and
inputting the plurality of complementary codes into a corresponding plurality of digital to analog converters (DACs).

22. The system of claim 21, wherein the number of ADCs in the plurality of ADCs exceeds the number of DACs in the plurality of DACs.

23. The system of claim 15, wherein generating the continuous analog dither comprises adjusting gain applied to the continuous analog dither.

24. The system of claim 15, wherein generating the continuous analog dither comprises adding uniform analog dither signals or Gaussian analog dither signals.

25. The system of claim 15, wherein the combiner is operational to combine the respective digital outputs by:

summing the digital outputs from the plurality of ADCs; and
subtracting therefrom a sum of the discrete offset voltage levels.

26. The system of claim 15, wherein the complementary code is operational to generate complementary discrete offset voltage levels which are mutually independent.

27. The system of claim 15, wherein the discrete offset voltage levels, the analog dither, and the input signals are coupled to the respective ADCs in the plurality of ADCs such that on different clock cycles, at least one discrete offset voltage level is coupled to a different one of the ADCs than the ADC the at least one discrete offset voltage level was coupled to on the prior clock cycle.

28. The system of claim 15, wherein a separate amount of continuous analog dither is generated for, and coupled to, each of the ADCs.

* * * * *